United States Patent
Della Fiora et al.

(10) Patent No.: US 6,459,580 B1
(45) Date of Patent: Oct. 1, 2002

(54) COOLING SYSTEM FOR REMOVING HEAT FROM AN OBJECT

(75) Inventors: Troy A. Della Fiora; Kevin L. Mundt, both of Spring; Joseph A. Jones, Conroe, all of TX (US)

(73) Assignee: Compaq Information Technologies Group, LP, Houston, TX (US)

( * ) Notice: Subject to any disclaimer, the term of this patent is extended or adjusted under 35 U.S.C. 154(b) by 0 days.

(21) Appl. No.: 09/778,406

(22) Filed: Feb. 7, 2001

(51) Int. Cl.[7] .................................................. H04K 7/20
(52) U.S. Cl. ...................... 361/697; 165/80.3; 165/122; 165/185; 257/722
(58) Field of Search ........................ 165/80.3, 121–125; 174/16.3; 62/259.2; 257/722; 361/687–688, 692–693, 694–697, 710; 415/177–178, 119, 53.1; 454/184

(56) References Cited

U.S. PATENT DOCUMENTS 5,309,983 A * 5/1994 Bailey ........................ 165/80.3
6,047,765 A * 4/2000 Zhan .......................... 165/80.3

* cited by examiner

Primary Examiner—Gregory Thompson
(74) Attorney, Agent, or Firm—Fletcher, Yoder & Van Someren

(57) ABSTRACT

A cooling system for providing rapid and uniform cooling of a variety of objects. The cooling system utilizes a fan that cooperates with a heat sink to provide an active heat sink. Additionally, the arrangement of the heat sink and the fan provide a relatively uniform and linear airflow over the heat sink to provide uniform cooling.

44 Claims, 6 Drawing Sheets

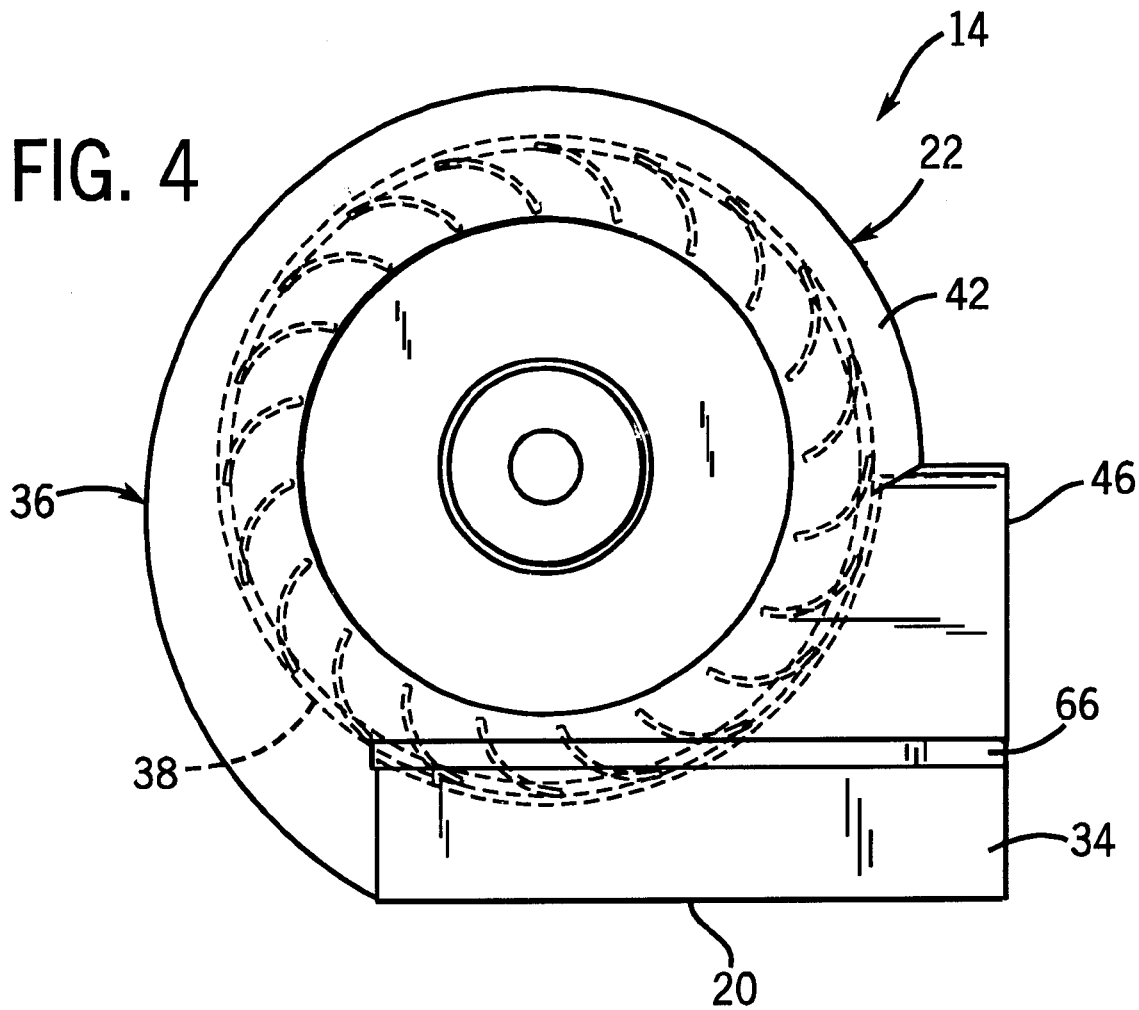

COOLING SYSTEM FOR REMOVING HEAT FROM AN OBJECT

FIELD OF THE INVENTION

The present invention relates generally to cooling systems for facilitating the removal of heat from a variety of objects, and particularly to a technique that utilizes a combined heat sink and fan.

BACKGROUND OF THE INVENTION

In a variety of products and applications, it is beneficial to remove heat from certain objects or areas. For,example, electronic devices, such as computers, servers, cameras, projectors, etc. often have heat producing components, such as processors or other microchips that generate heat. To ensure the desired operation and life of the component or overall device, it often is necessary or beneficial to cool such components.

Many types of heat sinks have been used to facilitate the removal of heat from a given object. Heat sinks often include a plurality of fins that increase the rate at which heat is transferred from the object and dissipated to the environment. In some applications, fans are used to circulate air in the vicinity of the heat sink to promote a greater rate of heat transfer from the heat sink to the surrounding environment.

Additionally, active heat sinks have been employed that utilize an axial fan dedicated to a specific heat sink. The axial fan is mounted to the heat sink or proximate the heat sink for providing a dedicated airflow over the heat sink. In a typical embodiment, an axial fan is mounted proximate the distal ends of heat transfer fins and air is directed along the heat transfer fins towards the base of the heat sink.

However, whether this particular arrangement or others are used, existing active heat sinks are subject to a variety of problems that inhibit desired removal of heat. For example, axial fans are susceptible to backpressure. When backpressure builds, the airflow effectively stops. This reduction or stoppage of airflow is problematic, because increases in the amount of heat removed from the heat sink is directly related to the velocity of the air flow induced by the fan. Additionally, axial fans expel air in a circular or twisting motion due to the rotational movement of fan blades that extend radially outward from a center axis or hub. This arrangement leaves a "dead zone" extending axially outward from the hub, e.g. along the axis, of the fan. The air expelled by the fan blades moves in the circular or twisting motion around this dead zone.

When the fan is positioned adjacent the heat transfer fins of a heat sink, this dead zone often is disposed generally at the center of the heat sink which typically is the area of greatest heat generation. Also, the circulating or twisting air tends to move laterally against the heat transfer fins. The fins interrupt or stall the movement of the air creating stagnant air between the heat transfer fins. Furthermore, the airflow tends to take the path of least resistance which is outward through the sides of the fins rather than to the center surface of the heat sink. Whether due to backpressure, outflow of air, occurrence of the dead zone or blockage of the circulating airflow by the heat transfer fins, reduced or stalled airflow across the heat sink base and heat transfer fins substantially inhibits the removal of heat from a given object.

Another problem with certain types of fans, such as axial fans is the acoustical output, i.e., noise. As the flow capacity requirements increase, to combat backpressure for example, the noise output can rise to unacceptable levels.

SUMMARY OF THE INVENTION

The present invention features a technique that utilizes an active heat sink which may be combined with a variety of components or incorporated in a variety of devices. The technique utilizes a fan, such as a blower fan, in a manner that promotes a high velocity airflow across a heat sink. In one example, a blower fan is combined with a heat sink such that the heat sink acts as what would otherwise be the base of the blower housing. Thus, the heat sink is positioned generally at the area of highest air velocity in the blower fan prior to experiencing a reduction in velocity when the air is expelled from the blower fan housing. This embodiment and others can be combined with a variety of components, such as processors or other heat generating devices, that are utilized in many types of products.

BRIEF DESCRIPTION OF THE DRAWINGS

The invention will hereafter be described with reference to the accompanying drawings, wherein like reference numerals denote like elements, and:

FIG. 4 is a side view of the device illustrated in FIG. 2;

DETAILED DESCRIPTION OF THE PREFERRED EMBODIMENTS

Figure 1:
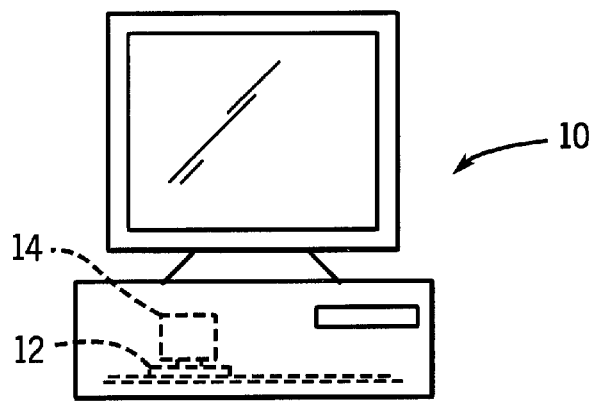
FIG. 1 is a front view of an exemplary device utilizing an active heat sink, according to one embodiment of the present invention.

Referring generally to FIG. 1, an exemplary device 10 is illustrated according to one embodiment of the present invention. Device 10 can be any of a variety of devices having a component 12 that requires or benefits from a cooling system 14. An exemplary component 12 is a heat-generating component, such as a processor or other "chip" that generate heat and benefit from or require removal of that heat. However, the heat generating component may be of a variety of other types that benefit from the removal of heat via cooling system 14.

Similarly, device 10 represents a variety of devices that have components which require or benefit from the removal of heat. For example, device 10 may comprise an electronic device. Such electronic devices include computers, servers, projectors, cameras and a variety of other devices. In the devices listed, integrated circuits are often used and the resultant heat needs to be removed. Cooling system 14 promotes the uniform and rapid removal of heat from such components and devices.

Figure 2:
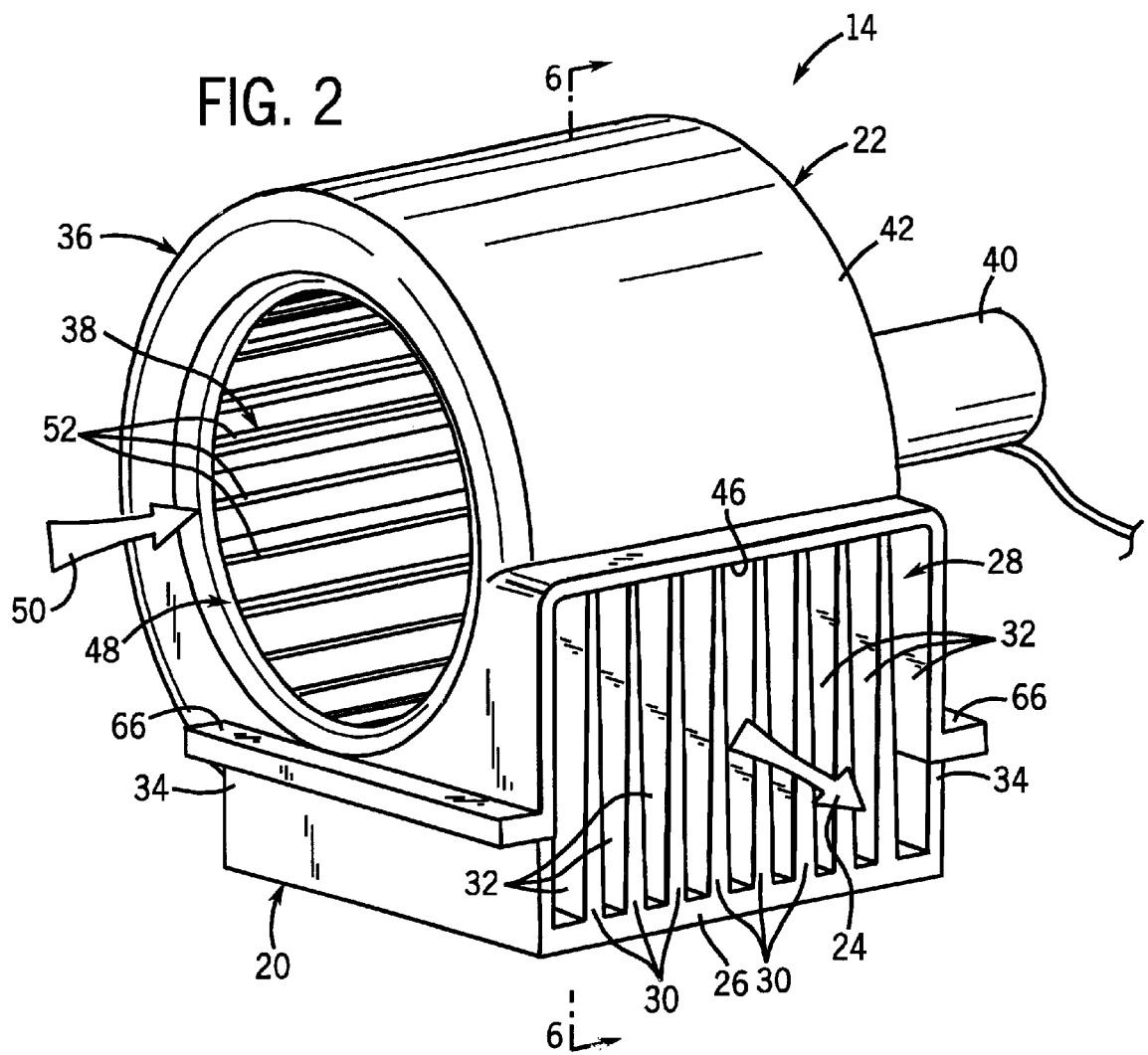
FIG. 2 is a perspective view of a fan mounted to a heat sink, according to one embodiment of the present invention.
Figure 3:
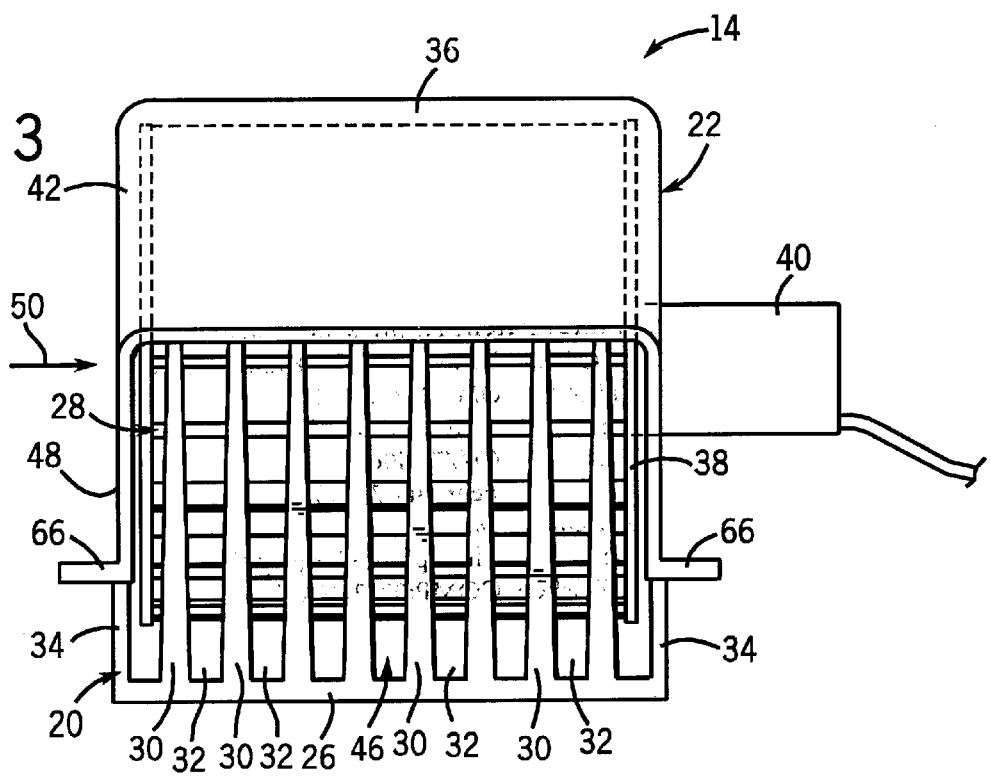
FIG. 3 is a front view of the device illustrated in FIG. 2.
Figure 3A:
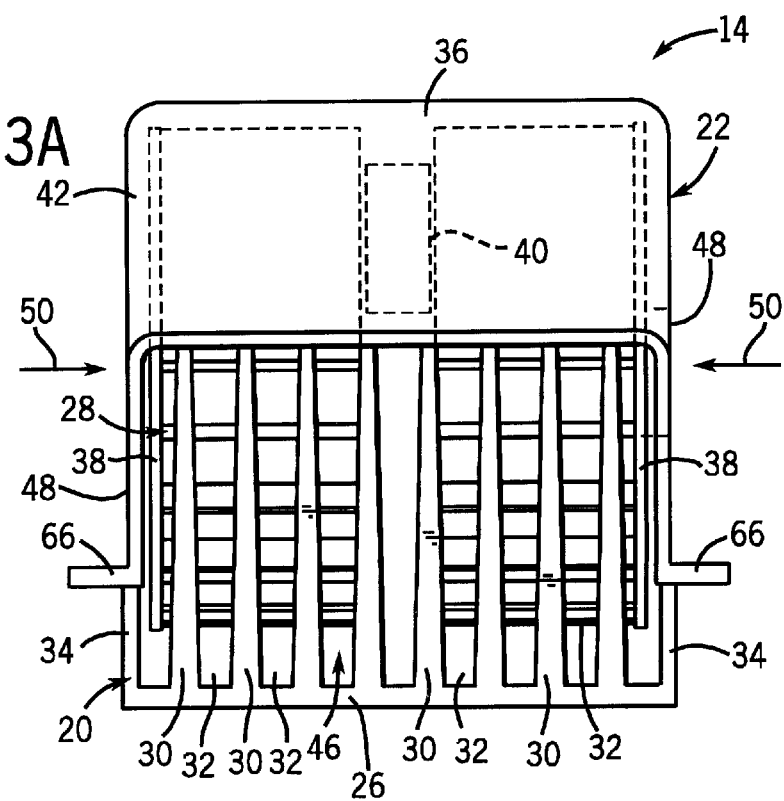
FIG. 3A illustrates an alternate embodiment of the device in FIG. 3.

Referring generally to FIGS. 2, 3, 3A and 4, an exemplary cooling system 14 is illustrated. In this embodiment, cooling system 14 comprises a heat sink 20 coupled to a fan 22 able to output a generally linear airflow, represented by reference numeral 24. An exemplary fan 22 is a blower fan, and fan 22 will be referred to as a blower fan throughout this description. Alternative styles of blower fan 22 are illustrated in FIGS. 3 and 3A. However, it should be realized that other types of fans able to output an appropriate linear airflow may be utilized.

An exemplary heat sink 20 includes a base 26 and a plurality of projections 28 for dissipating heat from base 26. Generally, base. 26 abuts component 12, e.g. a heat generating component, such that heat is transferred through base 26 and along projections 28 for greater transfer or dissipation of heat to the surrounding environment. In the illustrated embodiment, projections. 28 comprise a plurality of heat transfer fins 30 separated by a plurality of channels 32. Channels 32 may serve as airflow passages that direct the generally linear airflow 24 along heat transfer fins 30 to facilitate greater cooling. As discussed above, the higher the velocity of linear airflow 24 along heat sink 20 the greater the amount of heat that is removed from heat sink 20. When a relatively high velocity airflow flows along the substantial surface area created by heat transfer fins 30 of heat sink 20, large amounts of heat are rapidly dissipated to the surrounding environment. In the specific embodiment illustrated, heat sink 20 also includes a pair of outer walls 34 that generally extend from base 26 to facilitate the coupling of fan 22 to heat sink 20.

Figure 5:
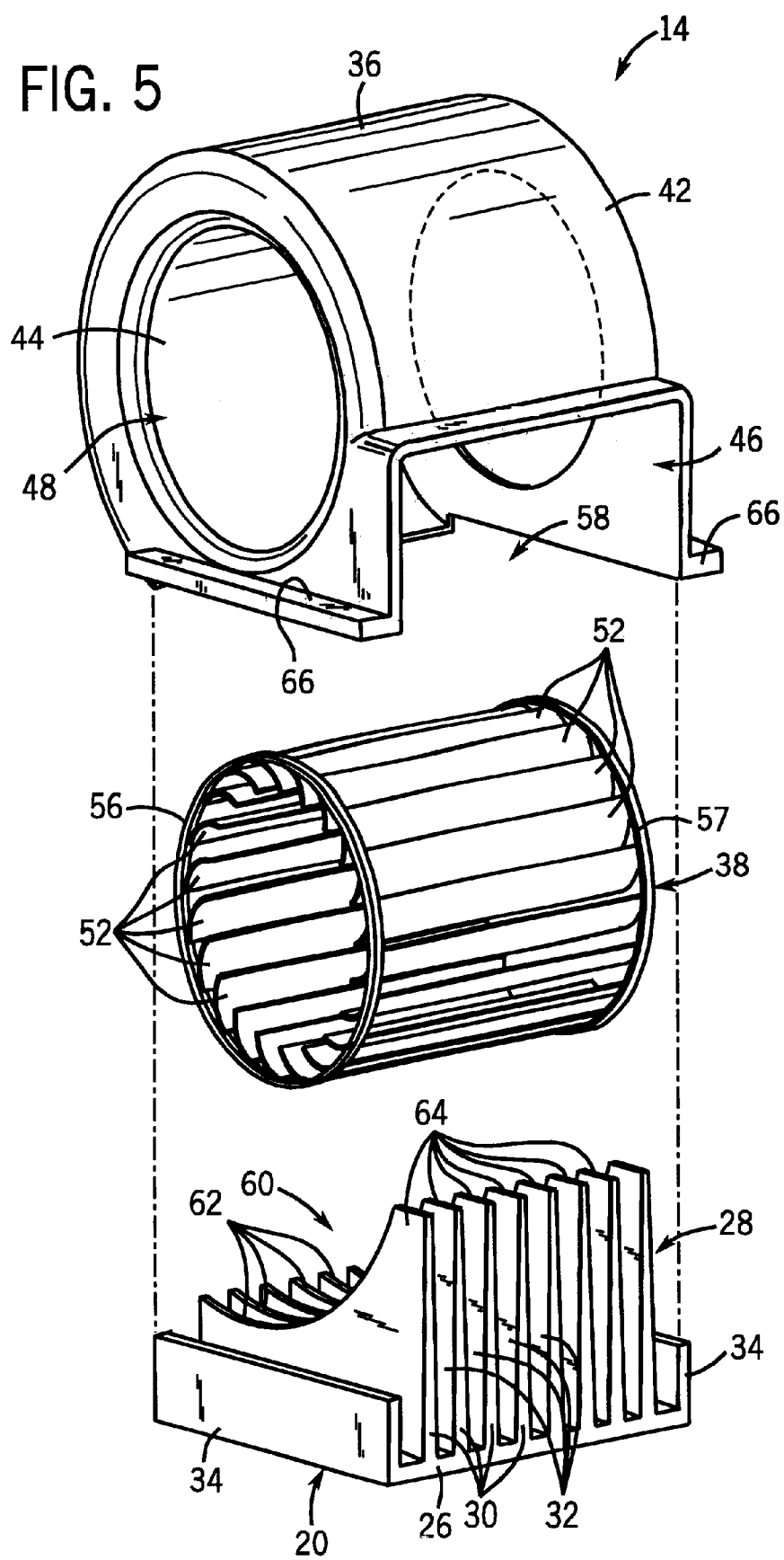
FIG. 5 is an exploded perspective view of the device illustrated in FIG. 2.

Blower fan 22 comprises a housing 36 and a fan cage 38 (see also FIG. 5). Blower fan 22 also includes a motor 40 coupled to fan cage 38 to rotate fan cage 38 within housing 36, as with conventional blower fans. (In the embodiment illustrated in FIG. 3A, motor 40 is used to rotate a pair of fan cages 38.)

The exemplary housing 36 includes a main housing portion 42 defining a curved inner surface 44 along which fan cage 38 moves during rotation. Housing 36 also includes an outlet 46 and an inlet 48. When fan cage 38 is rotated by motor 40, air is drawn in through inlet 48, accelerated along curved inner surface 44 and expelled through outlet 46, as best illustrated in the cross-sectional view of FIG. 6. Effectively, fan cage 38 moves air towards and through outlet 46 creating a lower pressure area in the center of the fan cage causing air to move into housing 36 through inlet 48, as represented by arrow 50. (In the embodiment illustrated in FIG. 3A, air is drawn in through a pair of opposed inlets 48 and expelled through outlet 46.)

Because of the design of fan cage 38 and fan housing 36, blower fan 22 is not susceptible to stoppage of outflow due to pressure buildup as described above with respect to axial-style fans. Additionally, the generally linear airflow 24 is substantially free of a centralized dead zone, as with axial fans, thereby allowing a more uniform airflow along heat sink 20, e.g. through flow passages 32 and along heat transfer fins 30. Furthermore, the linear flow is oriented generally parallel with the heat transfer fins 30, avoiding the stoppage that otherwise occurs when air is circulated into the side of a heat transfer fin. Also, the maximum velocity of air is along the base surface of the heat sink, which tends to be the highest source of heat.

Figure 6:
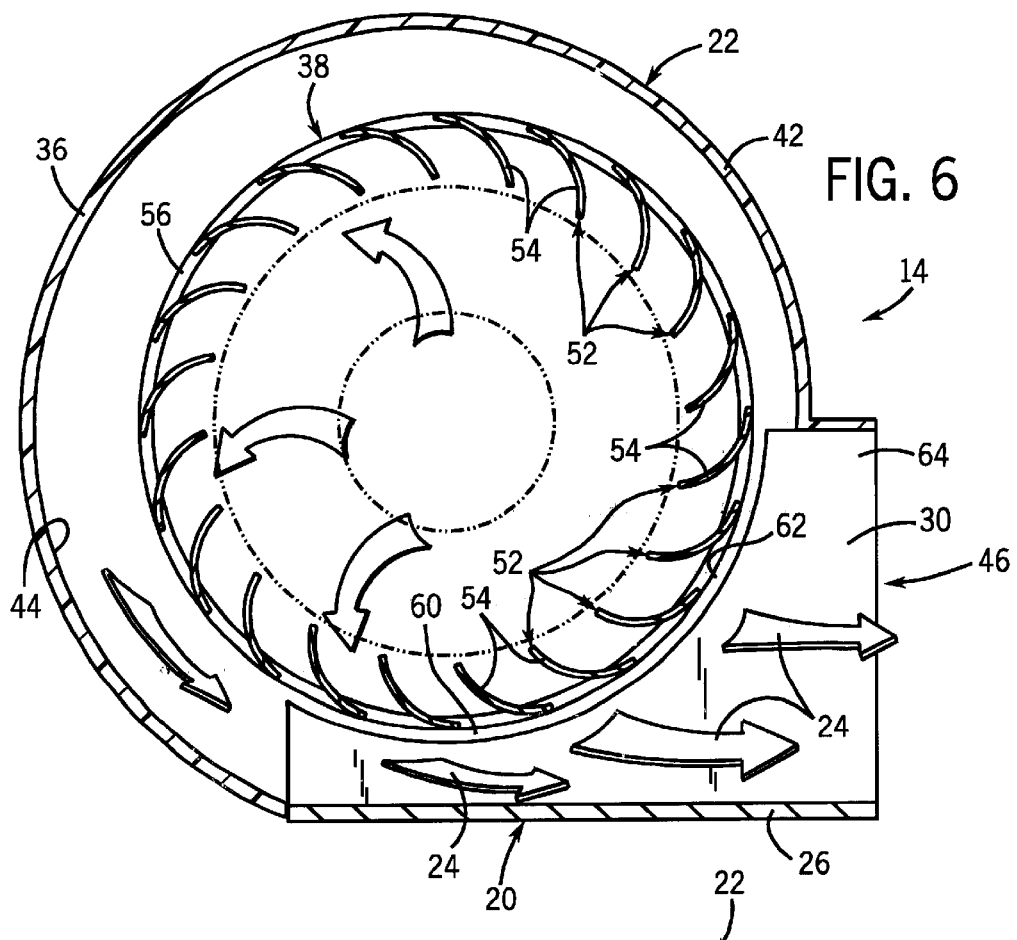
FIG. 6 is a cross-sectional view taken generally along line 6—6 of FIG. 2.

As best illustrated in FIG. 5, an exemplary fan cage 38 comprises a plurality of fan blades 52. Fan blades 52 generally are arranged parallel with each other in a circular pattern designed for rotation within and along curved inner surface 44 of housing 36. Thus, as fan cage 38 is rotated, the substantially parallel fan blades 52 move air along curved inner surface 44 until expelled through outlet 46. In this embodiment, each fan blade 52 has a generally curved cross-section 54, as best illustrated in FIG. 6. It should be noted that the curvature of fan blades 52 can be changed to, for example, the inverse of the curvature illustrated. Additionally, fan blades 52 are held in place by an end ring 56 and an end plate 57. In this embodiment, fan blades 52 extend between end ring 56 and end plate 57, however, a variety of other mounting systems may be used, including a central ring from which each fan blade 52 extends in opposite directions or a pair of end rings.

Although housing 36 may be disposed for cooperation with heat sink 20 in a variety of positions and according to a variety of methods, the figures illustrate one way of taking advantage of the airflow generated by fan cage 38. As illustrated, the exemplary housing 36 includes an open base region 58 to permit placement of housing 36 over heat sink 20 and heat transfer fins 30. In a conventional blower fan, housing 36 would include a solid base portion disposed to fill the opening 58 for conducting airflow out of the housing through an outlet, such as outlet 46. It is along this base region that the outflowing air experiences its highest velocities. Once the air is moved through an outlet, such as outlet 46, the velocity slows.

Accordingly, the exemplary embodiment illustrated uses heat sink 20 to fill open base region 58. This deployment allows the heat sink to effectively form the base portion of housing 36 such that the highest velocity airflow produced by blower fan 22 occurs across heat sink 20 and, in this embodiment, along heat transfer fins 30. High velocity airflow across heat transfer fins 30, of course, permits substantially greater heat removal for a given capacity fan. Efficient use of the output airflow, permits selection of a lower capacity/lower power fan than would otherwise be required for a given application thus also reducing acoustical output.

One way of utilizing the high velocity airflow along the base or bottom of housing 36 (see FIG. 6) is to form a recessed region 60 in heat sink 20 to accommodate fan cage 38. In one embodiment, recessed region 60 is formed by forming a cutout section 62 in each of a plurality of the heat transfer fins 30. The cutouts 62 may be arcuate to provide the overall recessed region 60 with a curvature generally matching the perimeter curvature of fan cage 38. However, other forms and shapes may be used to prepare cutout 62 and recessed region 60.

By way of example, recessed region 60 may be located such that heat transfer fins 30 have a greater reach or degree of extension proximate outlet 46. These raised or extended portions 64 typically extend along fan cage 38 to fill outlet 46, as best illustrated in FIGS. 3, 5 and 6.

As best shown in FIGS. 2, 4 and 5, housing 36 may be designed with engagement features 66.designed to engage outer walls 34 of heat sink 20. Engagement features 66 may be held to outer walls 34 by a variety of mechanisms, including adhesives, welds, clips or other methods of fastening. In this manner, fan cage 38 is disposed intermediate heat sink 20 and housing 36.

When fan cage 38 is rotated by motor 40, inflowing air 50 is drawn through inlet 48 and pushed or moved along curved inner surface 44 by fan blades 52. The air is continually accelerated along curved inner surface 44 and into contact with heat sink 20 which is a continuation from surface 44. In this example, the air is moved along air passages 32 through heat transfer fins 30 until it is expelled through outlet 46, as best illustrated in FIG. 6.

Although heat transfer fins 30 are disposed within the maximum velocity area of blower fan 22, other heat sink designs also can be employed. For example, heat transfer fins 30 can be designed to extend from outlet 46, be adjacent outlet 46, coupled to outlet 46 via an enclosed tube, extended along curved inner surface 44, etc. Additionally, a variety of other heat transfer projections and elements can be utilized to facilitate the removal of heat.

Figure 7:
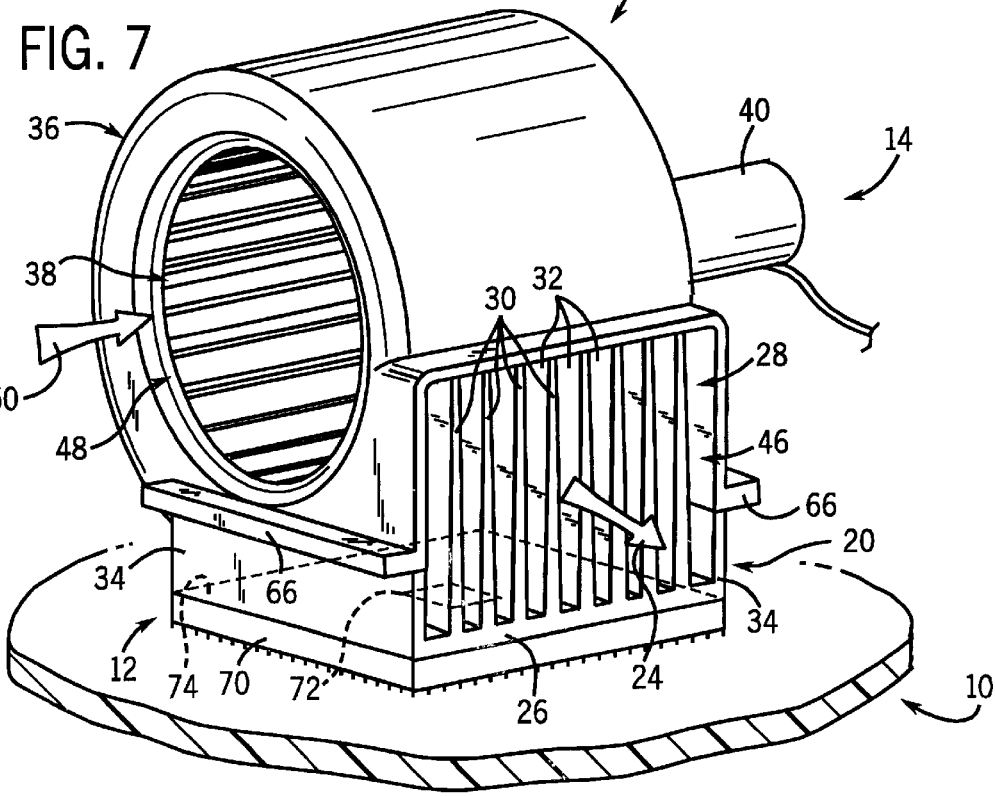
FIG. 7 is an isometric view of the device illustrated in FIG. 2 mounted to an exemplary object for placement in an exemplary device, such as that illustrated in FIG. 1.

Referring generally to FIG. 7, an exemplary use of cooling system 14 can be explained. In this embodiment, the cooling system is connected to a heat generating component (generally referred to as component 12), such as a processor 70. Processor 70 tends to produce the greatest heat, i.e., have the highest heat zone, at a central location 72. Base 26 of heat sink 20 is mounted against an upper surface 74 of processor 70 such that heat zone 72 and at least a substantial portion of the upper surface 74 are disposed in cooperation with base 26. Typically, a lower surface of base 26 is disposed in abutting engagement with upper surface 74 to facilitate a high degree of heat transfer from processor 70 to heat sink 20. For example, a contact surface can be formed across a die, a portion of the upper surface of processor 70 or across all of the upper surface of processor 70.

During operation of processor 70, heat is generated and conductively transferred to base 26 of heat sink 20. The heat energy is then transferred from base 26 through heat transfer fins 30 which provide substantial surface area through which the heat may be dissipated to the surrounding air. By operating blower fan 22, a high velocity airflow is continually moved past the surfaces of fins 30 and across the surface of base 26 for rapid removal of heat. Because of the uniform and linear airflow 24 through heat transfer fins 30, substantial removal of heat occurs throughout the heat sink and therefore across the extent of the contact surface between the heat sink 20 and processor 70. In other words, no dead zone exists in the vicinity of high heat zone 72 of processor 70. As discussed above, a variety of other heated or heat generating components can benefit from the rapid and uniform removal of heat as afforded by cooling system 14.

Figure 7A:
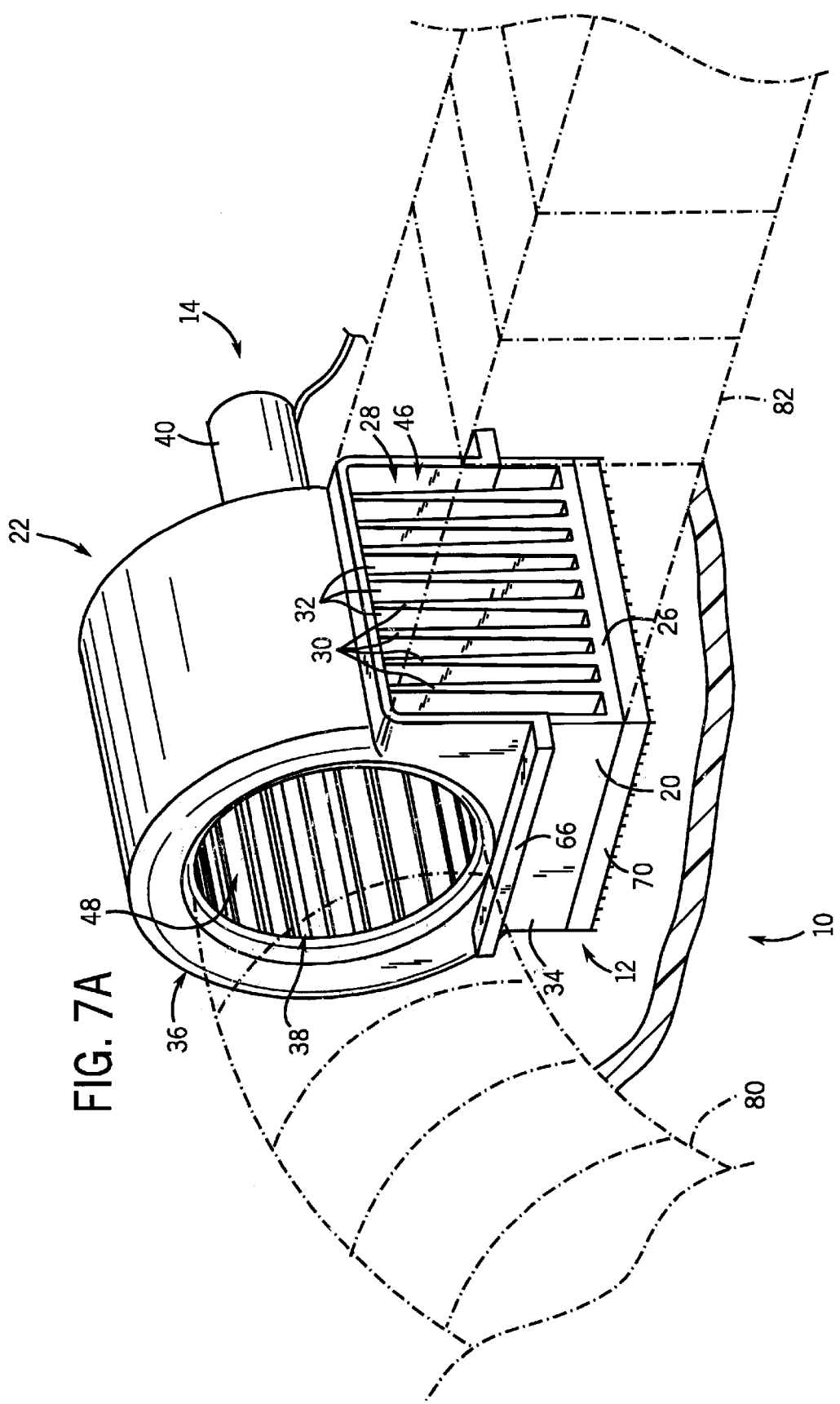
FIG. 7A illustrates an alternate embodiment of the device in FIG. 7.

As illustrated best in FIG. 7A, airflow can be supplied to blower 22 from a variety of desired locations via an appropriate airflow duct 80. Duct 80 allows air to be drawn from a remote location within a chassis or from a location outside the chassis housing processor 70. Similarly, an outflow duct 82 can be used to direct the airflow expelled through outlet 46 to a desired location away from blower 22. The use of one or both air ducts 80, 82 can permit greater flexibility in the location of blower fan 22 and heat sink 20.

It will be understood that the foregoing description is of exemplary embodiments of this invention, and that the invention is not limited to the specific forms shown. For example, the materials utilized to construct the heat sink and the blower fan may vary; the size and design of the cooling system may be adjusted according to the design and application of components and/or devices in which the cooling system is utilized; the arrangement of the heat sink and fan can be adjusted and their relative positions can be changed; other types of fans able to provide a generally uniform, linear airflow may be utilized; and the cooling system may be used in combination with a variety of components and devices. These and other modifications may be made in the design and arrangement of the elements without departing from the scope of the invention as expressed in the appended claims.

What is claimed is:

1. A cooling system for removing heat from an object, comprising:
   a heat sink having a plurality of heat transfer fins with a recessed region;
   a fan cage conformably disposed within the recessed region; and
   a housing to which the cage is rotatably mounted, at least a portion of the housing being disposed upon the heat sink.

2. The cooling system as recited in claim 1, further comprising a motor coupled to the fan cage.

3. A cooling system for removing heat from an object, comprising:
   a heat sink having a plurality of heat transfer fins with a recessed region;
   a fan cage comprising a plurality of blades, each blade being connected to an end ring, wherein the fan cage is conformably disposed within the recessed region; and
   a housing to which the cage is rotatably mounted, at least a portion of the housing being disposed upon the heat sink.

4. The cooling system as recited in claim 3, wherein the plurality of blades are oriented to direct a generally linear airflow through the plurality of heat transfer fins in a direction generally parallel with the plurality of heat transfer fins.

5. The cooling system as recited in claim 4, wherein the generally linear airflow is dispelled through a housing outlet.

6. The cooling system as recited in claim 5, wherein the housing outlet is disposed generally at an end of the plurality of heat transfer fins.

7. A cooling system for removing heat from an object, comprising:
   a heat sink; and
   a blower fan having a housing and a fan cage, wherein the housing is attached to the heat sink such that the fan cage is disposed intermediate the housing and the heat sink and wherein the housing comprises an axial inlet through which air may pass into the fan cage.

8. The cooling system as recited in claim 7, wherein the heat sink comprises a plurality of heat transfer projections disposed along at least a portion of the fan cage.

9. The cooling system as recited in claim 8, wherein the plurality of heat transfer projections are in the form of heat transfer fins, the heat transfer fins being disposed to form a plurality of generally parallel airflow passages.

10. The cooling system as recited in claim 9, wherein the heat transfer fins define a recessed area having a curvature generally matching a perimeter curvature of the fan cage.

11. The cooling system as recited in claim 9, wherein the heat sink is attached to the housing at a location exposed to the highest velocity airflow during operation of the blower fan.

12. The cooling system as recited in claim 9, wherein the fan cage comprises a plurality of blades, each blade being connected to an end ring.

13. The cooling system as recited in claim 12, wherein the plurality of blades are oriented to direct an airflow linearly and generally in parallel with the plurality of generally parallel airflow passages.

14. The cooling system as recited in claim 13, wherein the plurality of blades are generally parallel with one another.

15. A cooling system, comprising:
   a heat generating device;
   a heat sink having a plurality of heat transfer projections disposed upon the heat generating device; and
   a blower fan having a housing that cooperates with the heat sink to deploy a fan cage therebetween.

16. The cooling system as recited in claim 15, wherein the plurality of heat transfer projections are in the form of heat transfer fins, the heat transfer fins being disposed to form a plurality of generally parallel airflow passages.

17. The cooling system as recited in claim 16, wherein the heat transfer fins define a reclessed area having a curvature generally matching a perimeter curvature of the fan cage.

18. A cooling system, comprising:
   a heat generating device;
   a heat sink having a plurality of heat transfer projections disposed upon the heat generating device; and
   a blower fan having a housing that cooperates with the heat sink to deploy a fan cage therebetween wherein the fan cage comprises a plurality of blades, each blade being connected to an end ring.

19. The cooling system as recited in claim 18, wherein the plurality of blades are oriented to direct an airflow linearly and generally in parallel with the plurality of generally parallel airflow passages.

20. The cooling system as recited in claim 18, wherein the heat generating device comprises an integrated circuit.

21. The cooling system as recited in claim 19, wherein the heat generating device comprises a processor.

22. A cooling system, comprising:
   an electronic device having a heat producing component, a heat sink, and a blower fan having a fan cage and a housing, wherein the heat sink is in thermal contact with the heat producing component and the blower fan is attached to the heat sink such that the heat sink is positioned to help direct an airflow through an outlet of the housing.

23. The cooling system as recited in claim 22, wherein the heat sink comprises a plurality of heat transfer projections disposed along at least a portion of the fan cage.

24. The cooling system as recited in claim 23, wherein the heat transfer projections define a recessed area having a curvature generally matching a perimeter curvature of the fan cage.

25. The cooling system as recited in claim 23, wherein the heat sink is attached to the housing.

26. The cooling system as recited in claim 23, wherein the heat sink is attached to the housing at a location exposed to the highest velocity airflow during operation of the blower fan.

27. The cooling system as recited in claim 23, wherein the fan cage comprises a plurality of blades, each blade being connected between an end ring and an end plate.

28. The cooling system as recited in claim 27, wherein the plurality of blades are oriented to direct an airflow linearly and generally in parallel with the plurality of generally parallel airflow passages.

29. The cooling system as recited in claim 28, wherein the electronic device comprises a computer.

30. The cooling system as recited in claim 28, wherein the electronic device comprises a server.

31. The cooling system as recited in claim 28, wherein the electronic device comprises a projector.

32. The cooling system as recited in claim 28, wherein the electronic device comprises a camera.

33. A method for removing heat from an area, comprising:
   attaching a heat sink to a blower fan housing such that the heat sink is at least partially enclosed by the blower fan housing;
   mounting a fan cage in the blower fan housing; and
   orienting the fan cage to produce a generally linear airflow across the heat sink.

34. The method as recited in claim 33, further comprising rotating the fan cage to produce the generally linear airflow across the heat sink.

35. The method as recited in claim 33, further comprising providing the heat sink with a plurality of heat transfer fins arranged to be substantially parallel with the generally linear airflow across the heat sink.

36. The method as recited in claim 35, further comprising a recessed region in the plurality of heat transfer fins to at least partially receive the fan cage.

37. The method as recited in claim 35, wherein orienting the fan cage comprises arranging a plurality of fan blades of the fan cage in a generally parallel arrangement.

38. The method as recited in claim 33, further comprising attaching the heat sink to a heat generating device.

39. The method as recited in claim 38, wherein attaching comprises attaching the heat sink to a processor.

40. The method as recited in claim 35, further comprising attaching the heat sink to a heat generating device.

41. The method as recited in claim 40, wherein attaching comprises attaching the heat sink to a processor.

42. The method as recited in claim 34, further comprising drawing an incoming airflow to the blower fan housing through an inflow duct.

43. The method as recited in claim 34, further comprising discharging the generally linear airflow into an outlet duct.

44. The method as recited in claim 42, further comprising discharging the generally linear airflow into an outlet duct.

* * * * *